(12) United States Patent
Han et al.

(10) Patent No.: US 10,707,117 B2
(45) Date of Patent: Jul. 7, 2020

(54) INTERCONNECTION STRUCTURE AND METHOD FOR MANUFACTURING SAME

(71) Applicants: Semiconductor Manufacturing International (Beijing) Corporation, Beijing (CN); Semiconductor Manufacturing International (Shanghai) Corporation, Shanghai (CN)

(72) Inventors: Qiuhua Han, Shanghai (CN); Kai Yan, Shanghai (CN); Duan Yi Wu, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/181,817

(22) Filed: Nov. 6, 2018

(65) Prior Publication Data
US 2019/0181038 A1    Jun. 13, 2019

(30) Foreign Application Priority Data
Dec. 11, 2017  (CN) .......................... 2017 1 1306042

(51) Int. Cl.
*H01L 21/768*  (2006.01)
*H01L 23/532*  (2006.01)
(Continued)

(52) U.S. Cl.
CPC .. *H01L 21/76807* (2013.01); *H01L 21/76811* (2013.01); *H01L 21/76879* (2013.01);
(Continued)

(58) Field of Classification Search
CPC ......... H01L 21/76811; H01L 21/76879; H01L 23/5226
See application file for complete search history.

(56) References Cited

U.S. PATENT DOCUMENTS 9,490,168 B1 *  11/2016  Chen ................. H01L 21/76885
9,524,935 B2 *  12/2016  Rullan ................. H01L 23/528
(Continued)

*Primary Examiner* — William F Kraig
*Assistant Examiner* — Khatib A Rahman
(74) *Attorney, Agent, or Firm* — Brinks Gilson & Lione

(57) ABSTRACT

The present disclosure teaches interconnection structures and methods for manufacturing the same. In one implementation, a method may include: providing a substrate structure, including: a substrate, an interlayer dielectric layer on the substrate, a plurality of first through holes running through the interlayer dielectric layer, and a first metal layer filling the plurality of first through holes; forming a through hole structural layer on the substrate structure, where a dual-damascene through hole structure included in the through hole structural layer includes: a second through hole and a third through hole in the through hole structural layer, and an opening on the second through hole and the third through hole, and a part of the through hole structural layer between the second through hole and the third through hole is exposed in the opening; filling a second metal layer in the second through hole and the third through hole, where an upper surface of the second metal layer is lower than an upper surface of the part of the through hole structural layer; etching the part of the through hole structural layer so that the upper surface of the part is lower than the upper surface of the second metal layer; and forming, in the opening, a third metal layer connected to the second metal layer. The present disclosure addresses a problem of a cauliflower defect in the prior art.

9 Claims, 7 Drawing Sheets

(51) Int. Cl.
*H01L 23/522* (2006.01)
*H01L 23/528* (2006.01)

(52) U.S. Cl.
CPC ...... *H01L 23/5226* (2013.01); *H01L 23/5283* (2013.01); *H01L 23/53228* (2013.01)

(56) References Cited

U.S. PATENT DOCUMENTS

| | | | |
|---|---|---|---|
| 9,576,894 B2 * | 2/2017 | Singh | H01L 21/31144 |
| 9,691,654 B1 * | 6/2017 | Singh | H01L 21/76817 |
| 10,347,528 B1 * | 7/2019 | Singh | H01L 23/53266 |
| 2016/0155701 A1 * | 6/2016 | Mignot | H01L 23/5226 257/751 |
| 2016/0358851 A1 * | 12/2016 | Singh | H01L 21/31144 |
| 2017/0178953 A1 * | 6/2017 | Singh | H01L 21/76817 |
| 2018/0005952 A1 * | 1/2018 | Zhou | H01L 21/485 |

* cited by examiner

INTERCONNECTION STRUCTURE AND METHOD FOR MANUFACTURING SAME

RELATED APPLICATIONS

The present application claims priority to Chinese Patent Appln. No. 201711306042.8, filed Dec. 11, 2017, the entire disclosure of which is hereby incorporated by reference.

BACKGROUND

Technical Field

The present disclosure relates to the field of semiconductor technologies, and in particular, to an interconnection structure and a method for manufacturing same.

Related Art

In semiconductor technologies, an interconnection structure is an important structure used in a semiconductor device. FIG. 10A to FIG. 10C schematically show structural cross-sectional views in several phases in a process of manufacturing an interconnection structure of the prior art.

First, as shown in FIG. 10A, a dual-damascene through hole structure is formed in the semiconductor structure. The dual-damascene through hole structure includes a through hole 132, a through hole 133, and an opening 160 that are on a copper line 141. A titanium nitride (TiN) hard mask layer 153 is formed on the top of the semiconductor structure.

Next, as shown in FIG. 10B, a cobalt layer 142 is formed in the through holes 132 and 133 using a selective deposition process. On one hand, as shown in FIG. 10B, the selective deposition step easily causes the over-growth problem of the cobalt layer, resulting in a cauliflower defect 180. The cauliflower defect easily causes a cobalt layer connection in different through holes (as shown in a dashed line box of FIG. 10B). Consequently, a short circuit is caused, affecting normal work of the device, and even causing a device failure. On the other hand, as shown in FIG. 10B, when the TiN hard mask layer 153 is formed on the top of the semiconductor structure, due to the impact of the surface properties of the TiN hard mask layer, in the process of depositing the cobalt layer, a void 170 easily occurs in the cobalt layer, and this also affects the reliability of the device.

Next, as shown in FIG. 10C, a copper layer 143 is formed in the opening 160, thereby forming an interconnection structure.

It can be seen from the foregoing process that methods for manufacturing the interconnection structure of the prior art easily causes a cauliflower defect and a void defect, affecting the reliability of the device.

SUMMARY

The inventor of the present disclosure finds that problems exist in the prior art, and therefore provides a new technical solution for at least one of the foregoing problems.

One of the objectives of implementations of the present disclosure is to provide methods for manufacturing an interconnection structure that avoid a cauliflower defect to the greatest extent.

In a first aspect of the present disclosure, a method for manufacturing an interconnection structure is provided. The method may include: providing a substrate structure, where the substrate structure includes: a substrate, an interlayer dielectric layer on the substrate, a plurality of first through holes running through the interlayer dielectric layer, and a first metal layer filling the plurality of first through holes; forming a through hole structural layer on the substrate structure, where the through hole structural layer includes a dual-damascene through hole structure, the dual-damascene through hole structure including: a second through hole and a third through hole in the through hole structural layer, and an opening on the second through hole and the third through hole, the first metal layer in one of the plurality of first through holes is exposed in the second through hole, the first metal layer in another one of the plurality of first through holes is exposed in the third through hole, and the second through hole, the third through hole, and a part of the through hole structural layer between the second through hole and the third through hole are exposed in the opening; filling a second metal layer in the second through hole and the third through hole, where an upper surface of the second metal layer is lower than an upper surface of the part of the through hole structural layer between the second through hole and the third through hole; etching the part of the through hole structural layer between the second through hole and the third through hole, so that the upper surface of the part is lower than the upper surface of the second metal layer; and after etching the part of the through hole structural layer, forming, in the opening, a third metal layer connected to the second metal layer.

In some implementations, after the part of the through hole structural layer between the second through hole and the third through hole is etched, the upper surface of the part of the through hole structural layer is lower than the upper surface of the second metal layer by 50 Å to 200 Å.

In some implementations, the part of the through hole structural layer between the second through hole and the third through hole is etched under the following process condition: at 20-millitorr to 200-millitorr gas pressure and at 100-watt to 2000-watt etching power, and with argon (Ar) as a carrier gas, an etching process is executed by using a mixed gas of $C_4F_8$, $C_4F_6$, and $O_2$.

In some implementations, a gas flow range of the $C_4F_8$ is 10 sccm to 50 sccm; a gas flow range of the $C_4F_6$ is 10 sccm to 50 sccm; a gas flow range of the $O_2$ is 2 sccm to 30 sccm; and a gas flow range of the Ar is 100 sccm to 5000 sccm.

In some implementations, the through hole structural layer includes: an etching stop layer on the substrate structure, a first dielectric layer on the etching stop layer, and a second dielectric layer on the first dielectric layer; wherein a dielectric constant of the first dielectric layer is lower than a dielectric constant of the second dielectric layer; the dual-damascene through hole structure runs through the etching stop layer, the first dielectric layer, and the second dielectric layer; and the part of the through hole structural layer between the second through hole and the third through hole exposed in the opening is a part of the first dielectric layer between the second through hole and the third through hole.

In some implementations, a material of the first dielectric layer is a material with a low dielectric constant.

In some implementations, the step of forming a through hole structural layer on the substrate structure includes: forming the etching stop layer on the substrate structure, the first dielectric layer on the etching stop layer, the second dielectric layer on the first dielectric layer, and a hard mask layer on the second dielectric layer; etching the hard mask layer, the second dielectric layer, and the first dielectric layer, to form an initial dual-damascene through hole in which a partial surface of the etching stop layer is exposed; removing the hard mask layer after forming the initial dual-damascene through hole; and removing the exposed part of the etching stop layer by using the initial dual-damascene through hole by means of an etching process, to expose the first metal layer in the first through holes, so as to form the dual-damascene through hole structure.

In some implementations, materials of the first metal layer and the third metal layer include copper (Cu); and a material of the second metal layer includes cobalt.

In some implementations, in the step of forming the through hole structural layer, the first metal layer in two adjacent first through holes in the plurality of first through holes is exposed in each of the second through hole and the third through hole.

In forms of the foregoing manufacturing method, in the process of forming the second metal layer, the upper surface of the second metal layer is made to be lower than the upper surface of the part of the through hole structural layer between the second through hole and the third through hole, so as to prevent the over-growth problem of the second metal layer to the greatest extent, thereby avoiding the cauliflower defect of the second metal layer to the greatest extent and improving a reliability of the device. Then, the part of the through hole structural layer between the second through hole and the third through hole is etched so that the upper surface of the part is lower than the upper surface of the second metal layer, thereby avoiding, in the subsequent process of forming the third metal layer, the void problem that can easily occur in the subsequent process of filling the third metal layer and is caused by the second metal layer being lower than the through hole, thereby further improving a reliability of the device.

Further, before the step of filling the second metal layer in the second through hole and the third through hole, the hard mask layer has been removed to alleviate the impact of the surface properties of the hard mask layer on the deposition process of the subsequent second metal layer. Therefore, the void defect problem that easily occurs in the process of filling the second metal layer in the through hole can be avoided to the greatest extent, thereby improving the reliability of the device.

In a second aspect of the present disclosure, an interconnection structure is provided. The interconnection structure may include: a substrate structure, where the substrate structure includes: a substrate, an interlayer dielectric layer on the substrate, a plurality of first through holes running through the interlayer dielectric layer, and a first metal layer filling the plurality of first through holes; a through hole structural layer on the substrate structure, where the through hole structural layer includes a dual-damascene through hole structure, the dual-damascene through hole structure including: a second through hole and a third through hole in the through hole structural layer, and an opening on the second through hole and the third through hole, the first metal layer in one of the plurality of first through holes is exposed in the second through hole, the first metal layer in another one of the plurality of first through holes is exposed in the third through hole, and the second through hole, the third through hole, and a part of the through hole structural layer between the second through hole and the third through hole are exposed in the opening; a second metal layer filled in the second through hole and the third through hole, where an upper surface of the part of the through hole structural layer between the second through hole and the third through hole is lower than an upper surface of the second metal layer; and a third metal layer that is connected to the second metal layer and in the opening.

In some implementations, the upper surface of the part of the through hole structural layer between the second through hole and the third through hole is lower than the upper surface of the second metal layer by 50 Å to 200 Å.

In some implementations, the through hole structural layer includes: an etching stop layer on the substrate structure, a first dielectric layer on the etching stop layer, and a second dielectric layer on the first dielectric layer; a dielectric constant of the first dielectric layer is lower than a dielectric constant of the second dielectric layer; and the dual-damascene through hole structure runs through the etching stop layer, the first dielectric layer, and the second dielectric layer, where the part, of the through hole structural layer between the second through hole and the third through hole, exposed in the opening is a part of the first dielectric layer between the second through hole and the third through hole.

In some implementations, a material of the first dielectric layer is a material with a low dielectric constant.

In some implementations, materials of the first metal layer and the third metal layer include Cu; and a material of the second metal layer includes cobalt.

In some implementations, the first metal layer in two adjacent first through holes in the plurality of first through holes is exposed in each of the second through hole and the third through hole.

In forms the foregoing implementations, an interconnection structure is provided. The interconnection structure can prevent the cauliflower defect problem caused by overgrowth of the second metal layer therein to the greatest extent, and can prevent the void defect problem to the greatest extent, thereby improving a reliability of the device.

By means of the following detailed description of exemplary embodiments and implementations of the present disclosure with reference to the accompanying drawings, other features and advantages of the present disclosure will become clear.

BRIEF DESCRIPTION OF THE DRAWINGS

The accompanying drawings that constitute a part of the specification describe embodiments and implementations of the present disclosure, and are used to explain the principles of the present disclosure together with the specification.

Referring to the accompanying drawings, the present disclosure can be understood more clearly according to the following detailed description, where.

DETAILED DESCRIPTION

Figure 1:
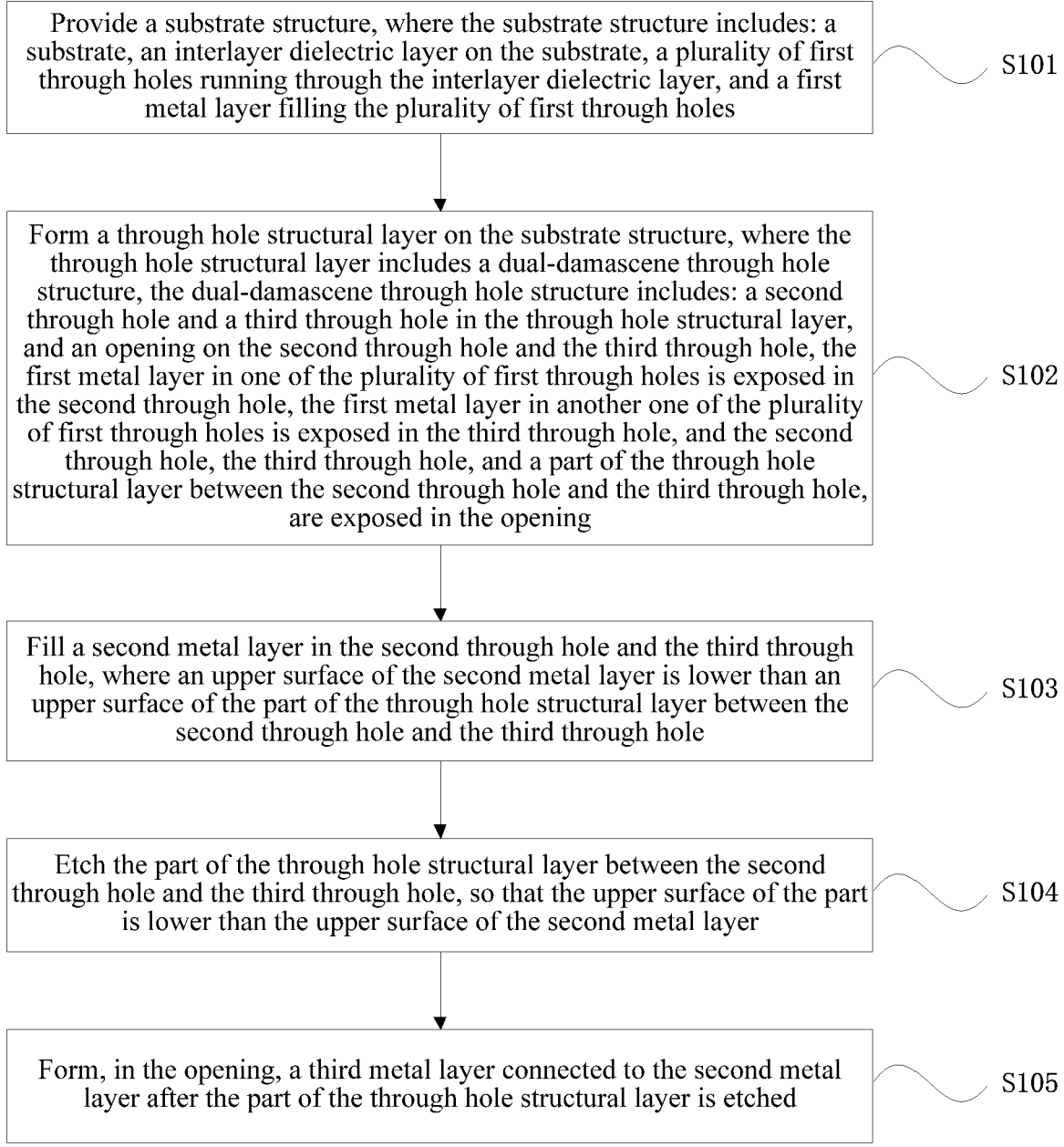
FIG. 1 shows a flowchart of one form of a method for manufacturing an interconnection structure.

Various exemplary embodiments and implementations of the present disclosure are described in detail with reference to the accompanying drawings. It should be noted that unless otherwise specifically stated, relative arrangement, numeric expressions and values of elements and steps described in these embodiments and implementations do not limit the scope of the present disclosure.

Moreover, it should be understood that, to facilitate description, the sizes of the parts shown in the drawings are not drawn according to an actual scale relationship.

The following description of at least one exemplary embodiment or implementation is merely illustrative, and is, by no means, should be used as a limitation to the present disclosure and application or use thereof.

Technologies, methods, and devices known by a person of ordinary skill in the related field may not be discussed in detail, but if appropriate, the technologies, methods, and devices should be considered as a part of the authorized specification.

In all examples shown and discussed herein, any specific value should be explained as merely exemplary, rather than be used as a limitation. Therefore, other examples of exemplary embodiments or implementations may have different values.

It should be noted that similar mark numbers and letters represent similar items in the following drawings. Therefore, once a particular item is defined in a drawing, the item does not need to be further discussed in subsequent drawings.

FIG. 1 shows a flowchart of one form of a method for manufacturing an interconnection structure. FIG. 2 to FIG. 9 schematically show structural cross-sectional views in several phases in a process of manufacturing an interconnection structure. Implementations of a process of manufacturing an interconnection structure is described in detail below with reference to FIG. 1 and FIG. 2 to FIG. 9. For example, an implementation of a manufacturing method of the present disclosure may be applied to a metal forming process of a back end of line (BEOL).

As shown in FIG. 1, in step S101, a substrate structure is provided. The substrate structure includes: a substrate, an interlayer dielectric layer on the substrate, a plurality of first through holes running through the interlayer dielectric layer, and a first metal layer filling the plurality of first through holes.

Figure 2:
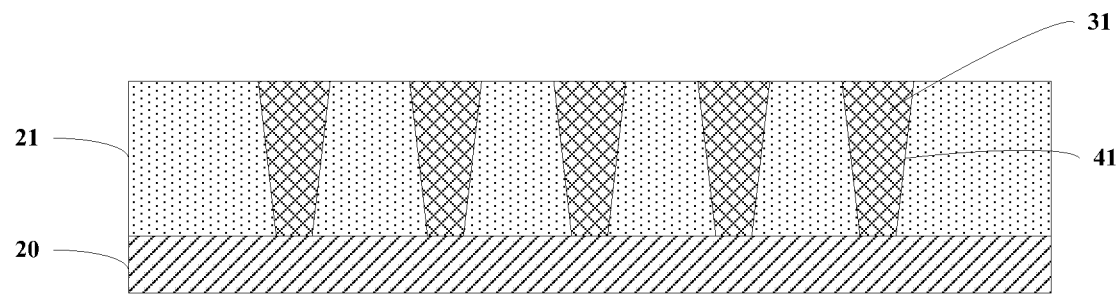
FIG. 2 schematically shows a structural cross-sectional view in a phase in a process of manufacturing an interconnection structure.

FIG. 2 schematically shows a structural cross-sectional view in step S101 in a process of manufacturing an interconnection structure according to an implementation of the present invention. As shown in FIG. 2, a substrate structure is provided. The substrate structure may include: a substrate (such as a silicon substrate) 20, an interlayer dielectric layer 21 on the substrate 20, a plurality of first through holes 31 running through the interlayer dielectric layer 21, and a first metal layer 41 filling the plurality of first through holes 31. For example, the material of the interlayer dielectric layer may include silica. The material of the first metal layer 41 may include Cu, and the like.

Referring to FIG. 1 again, in step S102, a through hole structural layer is formed on the substrate structure. The through hole structural layer includes a dual-damascene through hole structure. The dual-damascene through hole structure includes: a second through hole and a third through hole in the through hole structural layer, and an opening on the second through hole and the third through hole. The first metal layer in one of the first through holes of the plurality of first through holes is exposed in the second through hole. The first metal layer in another one of the plurality of first through holes is exposed in the third through hole. The second through hole, the third through hole, and a part of the through hole structural layer between the second through hole and the third through hole are exposed in the opening.

In some implementations, the through hole structural layer may include: an etching stop layer on the substrate structure, a first dielectric layer on the etching stop layer, and a second dielectric layer on the first dielectric layer. The dielectric constant of the first dielectric layer is lower than the dielectric constant of the second dielectric layer. The dual-damascene through hole structure runs through the etching stop layer, the first dielectric layer, and the second dielectric layer. The part of the through hole structural layer between the second through hole and the third through hole exposed in the opening is a part of the first dielectric layer between the second through hole and the third through hole.

FIG. 3 to FIG. 6 schematically show structural cross-sectional views in several phases of forming a through hole structural layer. An implementation of a process of forming a through hole structural layer of the present disclosure is described in detail below with reference to FIG. 3 to FIG. 6.

Figure 3:
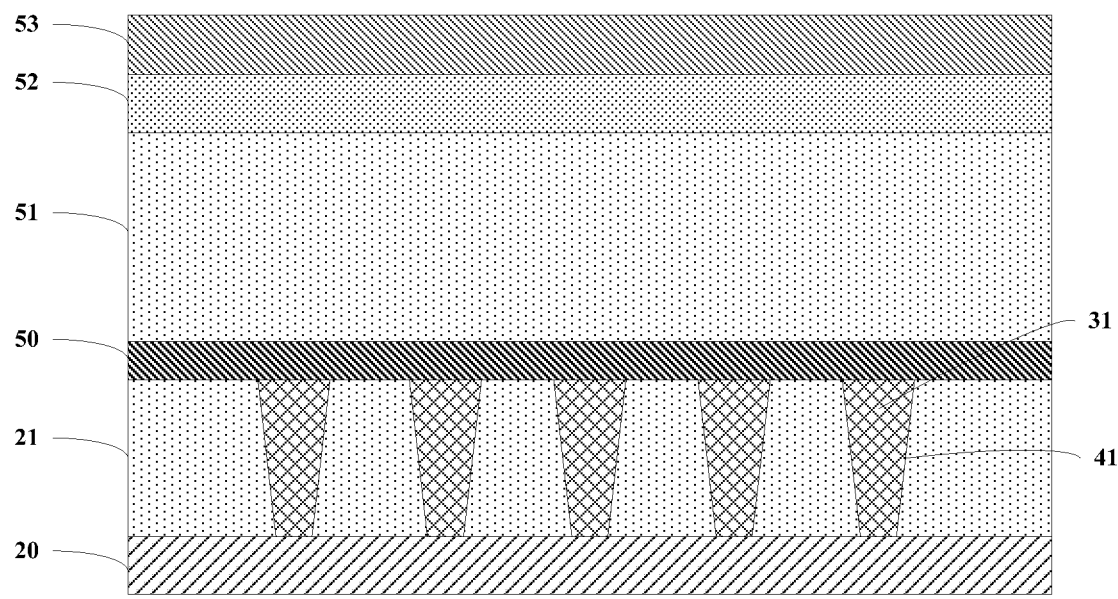
FIG. 3 schematically shows a structural cross-sectional view in a phase in a process of manufacturing an interconnection structure.

As shown in FIG. 3, for example, the etching stop layer 50 on the substrate structure shown in FIG. 2, the first dielectric layer 51 on the etching stop layer 50, the second dielectric layer 52 on the first dielectric layer 51, and a hard mask layer 53 on the second dielectric layer 52 are formed using a deposition process. The material of the etching stop layer may include silicon nitride (SiN) or silicon carbon nitride (SiCN). The dielectric constant of the first dielectric layer 51 is lower than the dielectric constant of the second dielectric layer 52. For example, the material of the first dielectric layer 51 may be a material with a low dielectric constant (that is, a low k material). For example, the low k material may include: SiOC (silicon oxide carbon), and the like. For example, the SiOC may be black diamond. The material of the second dielectric layer 52 may include silica, and the like. The second dielectric layer may implement the function of protecting the first dielectric layer. The material of the hard mask layer 53 may include TiN, and the like.

Figure 4:
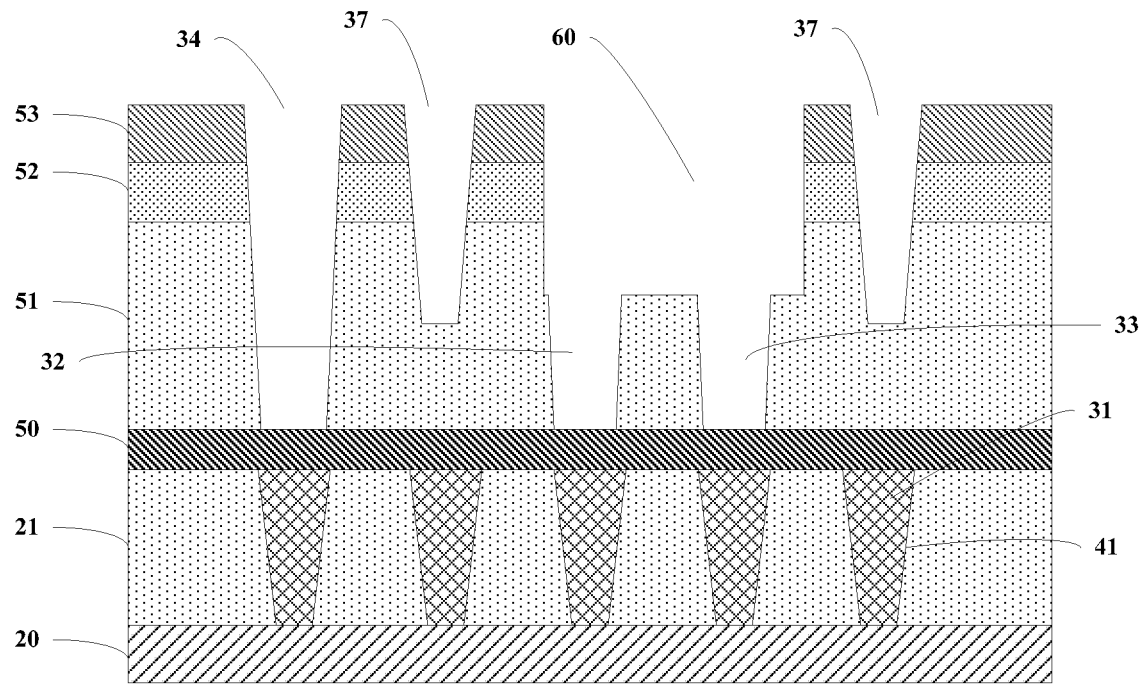
FIG. 4 schematically shows a structural cross-sectional view in a phase in a process of manufacturing an interconnection structure.

Next, as shown in FIG. 4, the hard mask layer 53, the second dielectric layer 52, and the first dielectric layer 51 are etched to form an initial dual-damascene through hole in which a partial surface of the etching stop layer 50 is exposed. The initial dual-damascene through hole may include: a second through hole 32 and a third through hole 33 in the first dielectric layer 51, and an opening 60 on the second through hole 32 and the third through hole 33. The partial surface of the etching stop layer 50 is exposed in the second through hole 32 and the third through hole 33. The second through hole 32 and the third through hole 33 may be respectively aligned with corresponding first through holes 31 below the second through hole 32 and the third through hole 33. The second through hole 32, the third through hole 33, and the part of the first dielectric layer 51 between the second through hole 32 and the third through hole 33 are exposed in the opening 60. For example, the initial dual-damascene through hole may be formed by using an existing process method such as photoetching or etching. The photoetching herein may relate to processes such as exposure, patterning, and removal of a photoresist. The etching herein may relate to a process such as etching the hard mask layer, the second dielectric layer, and the first dielectric layer using a patterned photoresist as a mask.

Optionally, in the etching step, as shown in FIG. 4, a fourth through hole 34 running through the hard mask layer 53, the second dielectric layer 52, and the first dielectric layer 51 may further be formed. A partial surface of the etching stop layer 50 is exposed in the fourth through hole 34. Optionally, in the etching step, some recesses 37 may further be formed, as shown in FIG. 4.

Figure 5:
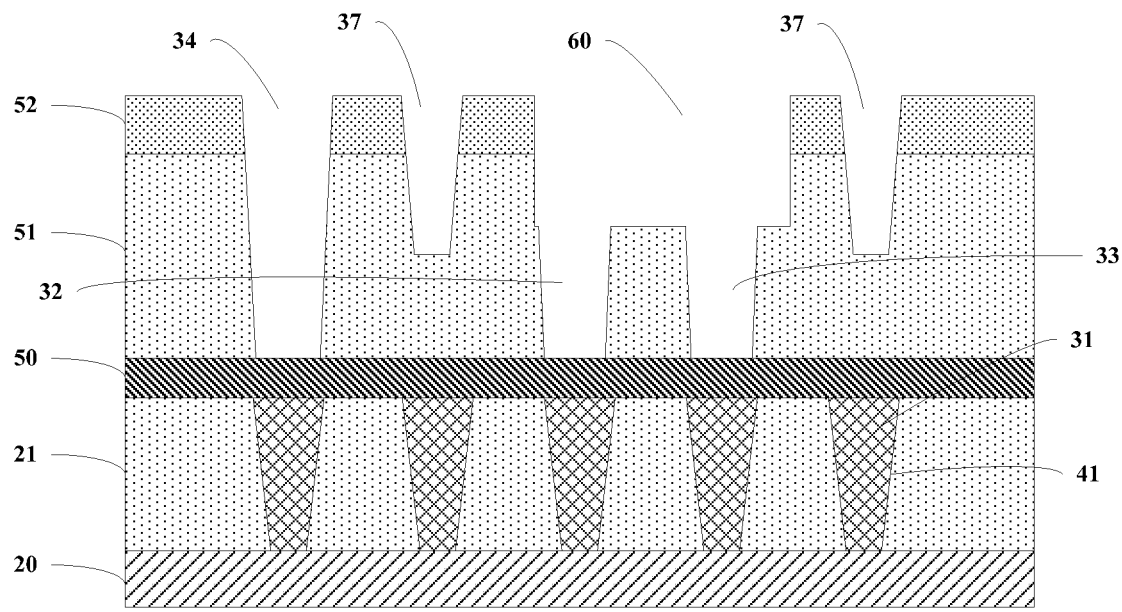
FIG. 5 schematically shows a structural cross-sectional view in a phase in a process of manufacturing an interconnection structure.

Next, as shown in FIG. 5, the hard mask layer 53 is removed after the initial dual-damascene through hole is formed. For example, the hard mask layer 53 may be removed using a wet etching process. An etchant used by the wet etching process may be a mixed solution including $NH_4OH$, $H_2O_2$, and $H_2O$.

Figure 6:
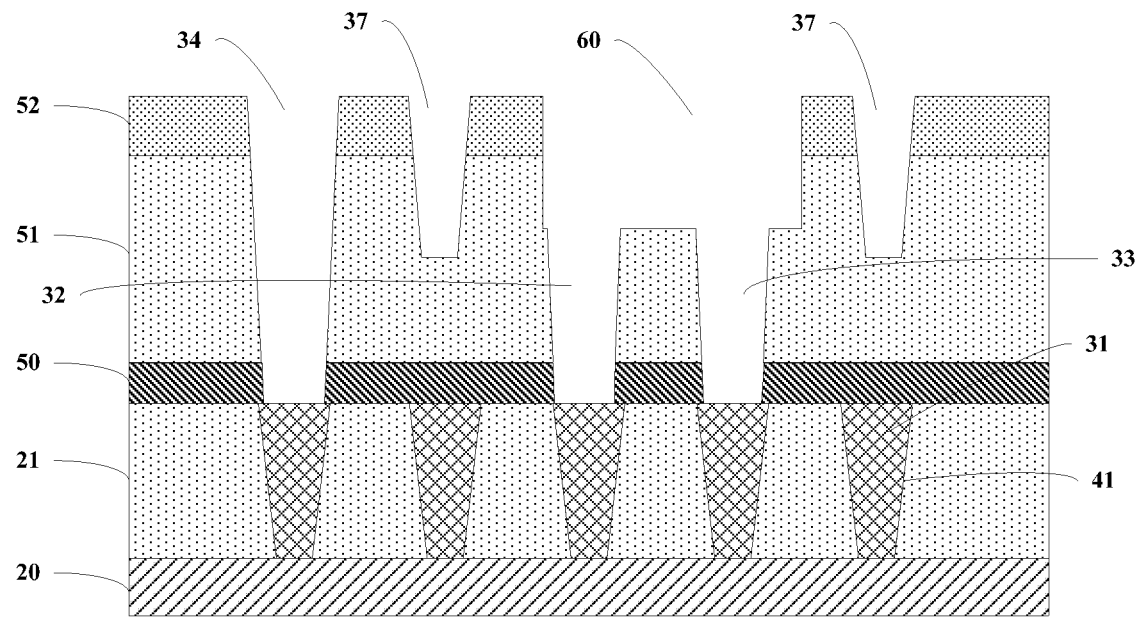
FIG. 6 schematically shows a structural cross-sectional view in a phase in a process of manufacturing an interconnection structure.

Next, as shown in FIG. 6, the exposed part of the etching stop layer 50 is removed using the initial dual-damascene through hole by means of an etching process to expose the first metal layer 41 in the first through holes 31, so as to form the dual-damascene through hole structure. In this step, the first metal layer in first through holes corresponding to each of the second through hole 32 and the third through hole 33 is exposed in each of the second through hole 32 and the third through hole 33 by means of etching, so as to form the needed dual-damascene through hole structure.

In forms the foregoing implementations, the through hole structural layer includes: the etching stop layer 50 on the substrate structure, the first dielectric layer 51 on the etching stop layer 50, and the second dielectric layer 52 on the first dielectric layer 51. The dual-damascene through hole structure runs through the etching stop layer 50, the first dielectric layer 51, and the second dielectric layer 52. As shown in FIG. 6, the dual-damascene through hole structure included in the through hole structural layer may include: the second through hole 32 and the third through hole 33 in the through hole structural layer, and the opening 60 on the second through hole 32 and the third through hole 33. The first metal layer 41 in one of the plurality of first through holes is exposed in the second through hole 32. The first metal layer 41 in another one of the plurality of first through holes is exposed in the third through hole 33. For example, as shown in FIG. 6, the first metal layer in two adjacent first through holes in the plurality of first through holes is exposed in each of the second through hole 32 and the third through hole 33. The second through hole 32, the third through hole 33, and the part of the through hole structural layer between the second through hole 32 and the third through hole 33 are exposed in the opening 60. For example, a part of the first dielectric layer 51 between the second through hole 32 and the third through hole 33 is exposed.

It should be noted that although in forms of the foregoing implementations, it is described that the through hole structural layer includes the etching stop layer, the first dielectric layer, and the second dielectric layer, the through hole structural layer may alternatively include only the etching stop layer and the first dielectric layer, or include only the first dielectric layer, and the like. Certainly, the through hole structural layer may alternatively include more layers other than the etching stop layer, the first dielectric layer, and the second dielectric layer, as long as the dual-damascene through hole structure can be formed. Therefore, the scope of the present disclosure is not limited thereto.

Optionally, as shown in FIG. 6, in this etching step, not only the part of the etching stop layer exposed in the second through hole 32 and the third through hole 33 is removed, but also the part of the etching stop layer exposed in the fourth through hole 34 can be removed, so that the first metal layer in a first through hole corresponding to the fourth through hole is exposed in the fourth through hole 34.

In forms of the foregoing implementation, the through hole structural layer is formed on the substrate structure. The through hole structural layer includes the dual-damascene through hole structure. Before the step to be described later of filling the second metal layer in the second through hole and the third through hole, the hard mask layer has been removed in the step of forming the through hole structural layer to alleviate the impact of the surface properties of the hard mask layer on the deposition process of the subsequent second metal layer. Therefore, the void problem that easily occurs in the process of filling the second metal layer in the through hole can be avoided to the greatest extent, thereby improving a reliability of the device.

Referring to FIG. 1 again, in step S103, a second metal layer is filled in the second through hole and the third through hole. An upper surface of the second metal layer is lower than an upper surface of the part of the through hole structural layer between the second through hole and the third through hole.

Figure 7:
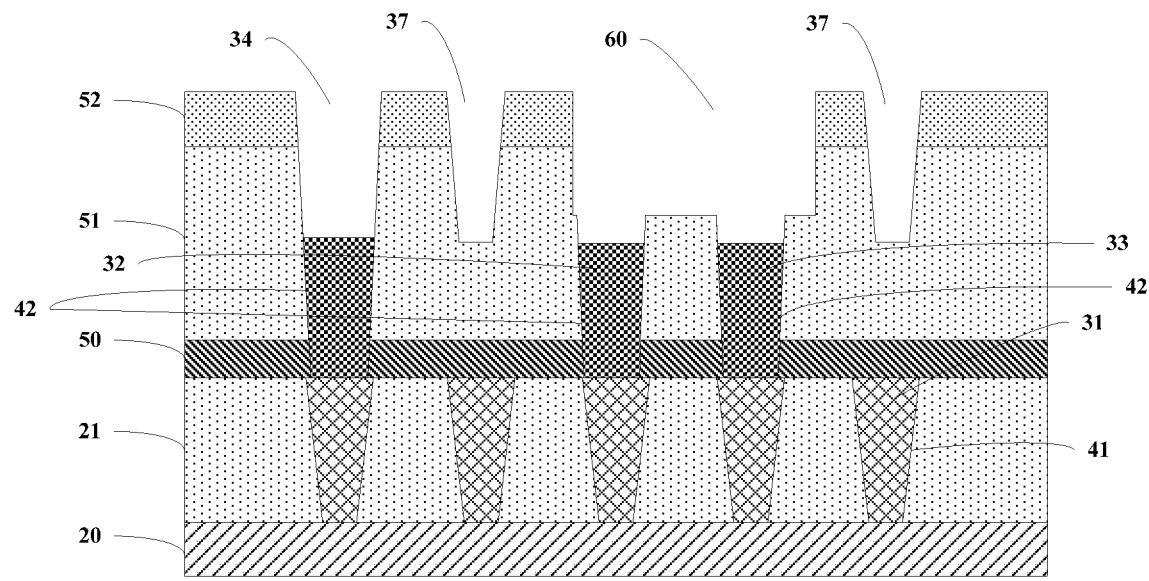
FIG. 7 schematically shows a structural cross-sectional view in a phase in a process of manufacturing an interconnection structure.

FIG. 7 schematically shows a structural cross-sectional view in step S103 in a process of manufacturing an interconnection structure according to an embodiment of the present invention. As shown in FIG. 7, for example, a second metal layer 42 is filled in the second through hole 32 and the third through hole 33 by using a selective deposition (such as chemical vapor deposition (CVD)) process. An upper surface of the second metal layer 42 is lower than the upper surface of the part of the through hole structural layer between the second through hole 32 and the third through hole 33. For example, the upper surface of the second metal layer 42 is lower than the upper surface of the part of the first dielectric layer 51 between the second through hole 32 and the third through hole 33. It should be noted that the selective deposition herein is deposition or growth only on a surface with a metal (such as the first metal layer) in the deposition process. The material of the second metal layer 42 may include cobalt, and the like. Optionally, the second metal layer 42 may further be filled in the fourth through hole 34.

Referring to FIG. 1 again, in step S104, the part of the through hole structural layer between the second through hole and the third through hole is etched, so that the upper surface of the part is lower than the upper surface of the second metal layer.

Figure 8:
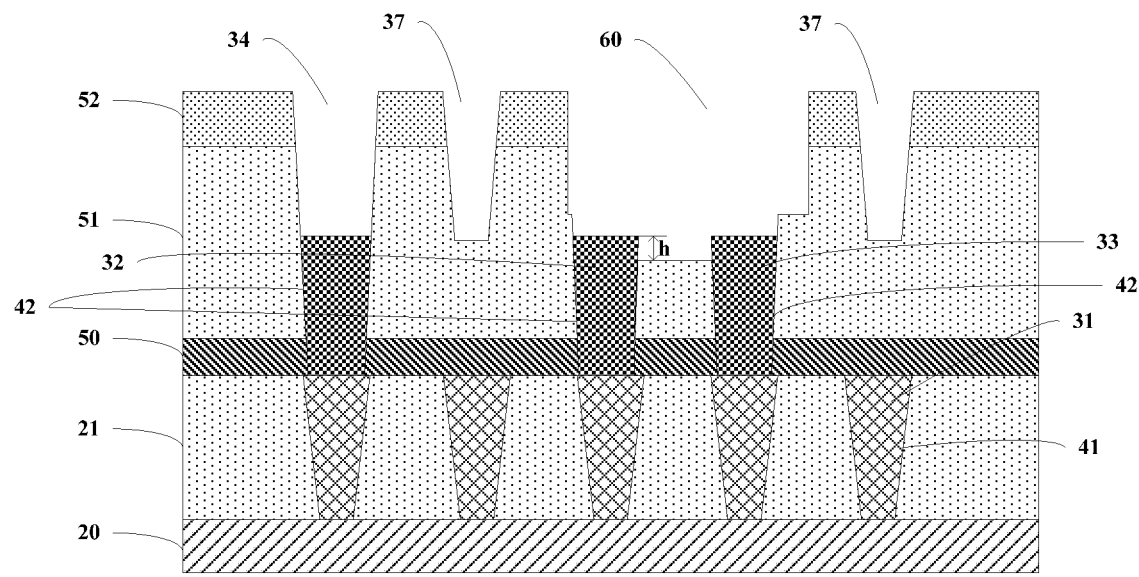
FIG. 8 schematically shows a structural cross-sectional view in a phase in a process of manufacturing an interconnection structure.

FIG. 8 schematically shows a structural cross-sectional view in step S104 in a process of manufacturing an interconnection structure according to an embodiment of the present invention. As shown in FIG. 8, the part of the through hole structural layer between the second through hole 32 and the third through hole 33 (such as the part of the first dielectric layer 51 between the second through hole 32 and the third through hole 33) is etched, so that the upper surface of the part is lower than the upper surface of the second metal layer 42. In some implementations, after the etching step, the upper surface of the part of the through hole structural layer is lower than the upper surface of the second metal layer 42 by 50 Å to 200 Å. For example, as shown in FIG. 8, after the etching step, a height difference h between the upper surface of the part of the first dielectric layer 51 between the second through hole 32 and the third through hole 33 and the upper surface of the second metal layer 42 may be 50 Å to 200 Å (such as 80 Å, 100 Å, or 150 Å). Herein, the upper surface of the part of the first dielectric layer 51 is lower than the upper surface of the second metal layer 42.

In some implementations, the part of the through hole structural layer between the second through hole and the third through hole is etched under the following process condition: at 20-millitorr to 200-millitorr (such as 50-millitorr, 100-millitorr, or 150-millitorr) gas pressure and at 100-watt to 2000-watt (such as 300-watt, 500-watt, 1000-watt, or 1500-watt) etching power, and with Ar as a carrier gas, the etching process is executed by using a mixed gas of $C_4F_8$, $C_4F_6$, and $O_2$.

In some implementations, a gas flow range of the $C_4F_8$ may be 10 sccm to 50 sccm. For example, the gas flow of the $C_4F_8$ may be 20 sccm, 30 sccm, 40 sccm, or the like.

In some implementations, a gas flow range of the $C_4F_6$ may be 10 sccm to 50 sccm. For example, the gas flow of the $C_4F_6$ may be 20 sccm, 30 sccm, 40 sccm, or the like.

In some implementations, a gas flow range of the $O_2$ may be 2 sccm to 30 sccm. For example, the gas flow of the $O_2$ may be 5 sccm, 10 sccm, 20 sccm, or the like.

In some implementations, a gas flow range of the Ar may be 100 sccm to 5000 sccm. For example, the gas flow of the Ar may be 500 sccm, 1000 sccm, 2000 sccm, 3000 sccm, 4000 sccm, or the like.

Referring to FIG. 1 again, in step S105, after the part of the through hole structural layer is etched, a third metal layer connected to the second metal layer is formed in the opening.

Figure 9:
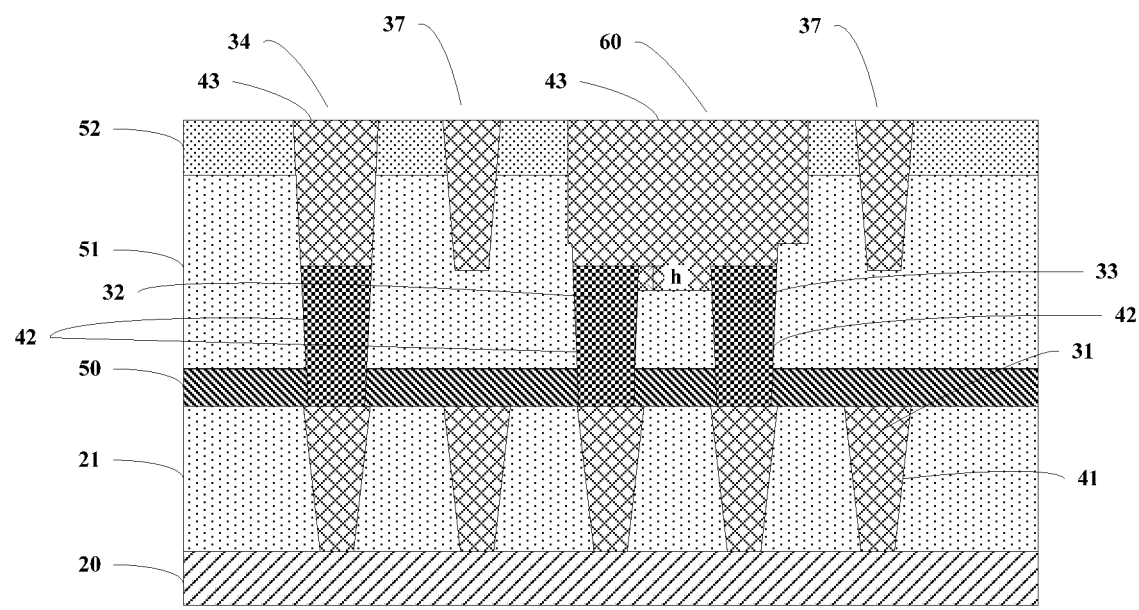
FIG. 9 schematically shows a structural cross-sectional view in a phase in a process of manufacturing an interconnection structure.
Figure 10A:
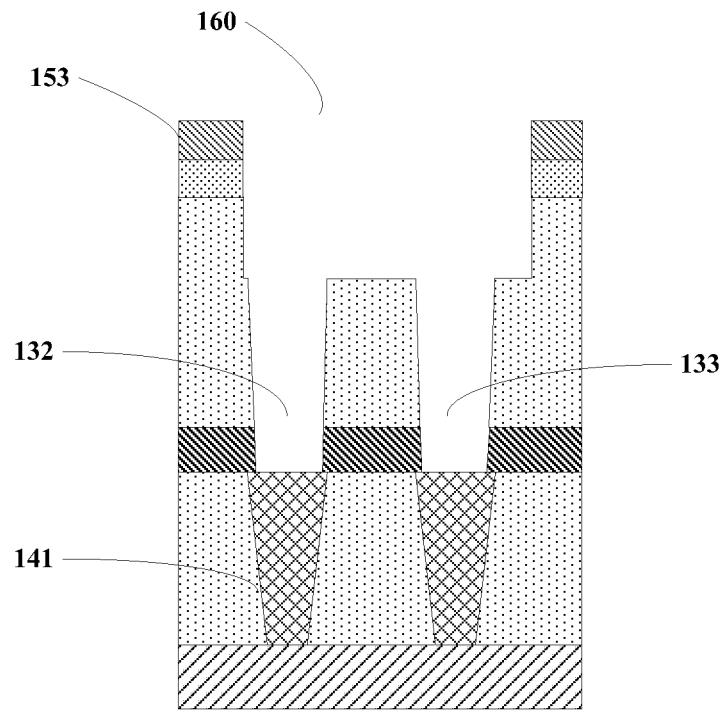
FIG. 10A to FIG. 10C schematically show structural cross-sectional views in several phases in a process of manufacturing an interconnection structure of the prior art.
Figure 10B:
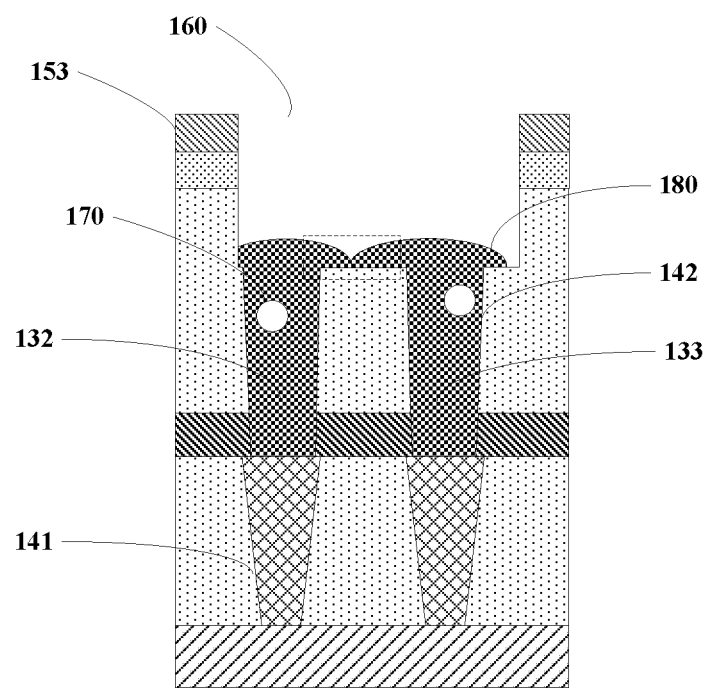
Figure 10C:
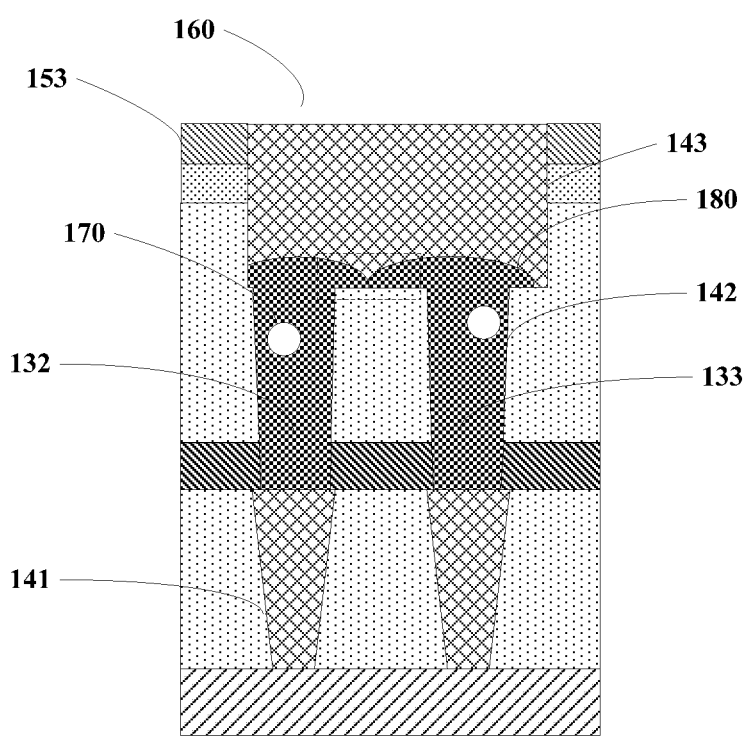

FIG. 9 schematically shows a structural cross-sectional view in step S105 in a process of manufacturing an interconnection structure. As shown in FIG. 9, the third metal layer 43 connected to the second metal layer 42 is formed in the opening 60. For example, the material of the third metal layer 43 may include Cu, and the like. Optionally, the third metal layer 43 may further be filled in the fourth through hole 43, the recesses 37, and the like.

In some implementations, a block layer (the block layer can prevent the subsequently formed third metal layer (such as Cu) from diffusing into the second metal layer (such as cobalt)) may be first formed on the bottom and a side wall of the opening 60, then a seed crystal layer is formed on the block layer. Next, the third metal layer filling the opening 60 is formed on the seed crystal layer by using an electrochemical plating (ECP) process, and subsequently, chemical mechanical planarization (CMP) is performed on the third metal layer.

Above, implementations of methods for manufacturing an interconnection structure according to the present disclosure are provided. In implementations of the manufacturing method, in the process of forming the second metal layer, the upper surface of the second metal layer is made to be lower than the upper surface of the part of the through hole structural layer between the second through hole and the third through hole so as to prevent the over-growth problem of the second metal layer to the greatest extent, thereby avoiding the cauliflower defect of the second metal layer to the greatest extent and improving a reliability of the device. Then, the part of the through hole structural layer between the second through hole and the third through hole is etched so that the upper surface of the part is lower than the upper surface of the second metal layer, thereby avoiding, in the subsequent process of forming the third metal layer, the void problem that easily occurs in the subsequent process of filling the third metal layer and is caused by that the second metal layer is lower than the through hole. As a result, a reliability of the device is further improved.

Further, in forms of this implementation of the present disclosure, before the step of filling the second metal layer in the second through hole and the third through hole, the hard mask layer has been removed to alleviate the impact of the surface properties of the hard mask layer on the deposition process of the subsequent second metal layer. Therefore, the void problem that easily occurs in the process of filling the second metal layer in the through hole can be avoided to the greatest extent, thereby improving a reliability of the device.

In forms of the foregoing manufacturing method, an interconnection structure according to implementations of the present disclosure is further formed. As shown in FIG. 9, the interconnection structure may include a substrate structure. The substrate structure may include: a substrate 20, an interlayer dielectric layer 21 on the substrate 20, a plurality of first through holes 31 running through the interlayer dielectric layer 21, and a first metal layer 41 filling the plurality of first through holes 31. For example, the material of the first metal layer 41 may include Cu.

As shown in FIG. 9, the interconnection structure may further include a through hole structural layer on the substrate structure. The through hole structural layer may include a dual-damascene through hole structure. The dual-damascene through hole structure may include: a second through hole 32 and a third through hole 33 in the through hole structural layer, and an opening 60 on the second through hole 32 and the third through hole 33. The first metal layer 41 in one of the plurality of first through holes is exposed in the second through hole 32. The first metal layer 41 in another one of the plurality of first through holes is exposed in the third through hole 33. For example, the first metal layer in two adjacent first through holes in the plurality of first through holes is exposed in each of the second through hole 32 and the third through hole 33. The second through hole 32, the third through hole 33, and the part of the through hole structural layer between the second through hole 32 and the third through hole 33 are exposed in the opening 60.

In some implementations, as shown in FIG. 9, the through hole structural layer may include: an etching stop layer 50 on the substrate structure, a first dielectric layer 51 on the etching stop layer 50, and a second dielectric layer 52 on the first dielectric layer 51.

The dielectric constant of the first dielectric layer 51 is lower than the dielectric constant of the second dielectric layer 52. For example, the material of the first dielectric layer 51 may be a material with a low dielectric constant. The dual-damascene through hole structure runs through the etching stop layer 50, the first dielectric layer 51, and the second dielectric layer 52. The part, of the through hole structural layer between the second through hole and the third through hole, exposed in the opening is a part of the first dielectric layer 51 between the second through hole 32 and the third through hole 33.

As shown in FIG. 9, the interconnection structure may further include a second metal layer 42 filled in the second through hole 32 and the third through hole 33. For example, the material of the second metal layer 42 may include cobalt. An upper surface of the part of the through hole structural layer between the second through hole and the third through hole is lower than an upper surface of the second metal layer. For example, as shown in FIG. 9, the part of the first dielectric layer 51 between the second through hole 32 and the third through hole 33 is lower than the upper surface of the second metal layer 42. In some implementations, the upper surface of the part of the through hole structural layer between the second through hole and the third through hole (such as the part of the first dielectric layer 51 between the second through hole 32 and the third through hole 33) is lower than the upper surface of the second metal layer by 50 Å to 200 Å.

As shown in FIG. 9, the interconnection structure may further include a third metal layer 43 that is connected to the second metal layer 42 and in the opening 60. For example, the material of the first metal layer 43 may include Cu.

In forms of the foregoing implementations, an interconnection structure is provided. The interconnection structure can prevent the cauliflower defect problem caused by overgrowth of the second metal layer therein to the greatest extent, and can prevent the cavity defect problem to the greatest extent, thereby improving a reliability of the device.

Forms of implementations of the present disclosure have been described above in detail. To avoid obstructing the concepts of the present disclosure, some details commonly known in the field are not described. A person skilled in the art will understand, by all means according to the foregoing description, how to implement the technical solutions disclosed herein.

Although some specific embodiments and implementations of the present disclosure have been described in detail using illustrative examples, a person skilled in the art will understand that the foregoing examples are used only for description, rather than limiting the scope of the present disclosure. A person skilled in the art should understand that the foregoing embodiments and implementations can be modified without departing from the scope and the spirit of the present invention. The scope of the present disclosure is subject to the appended claims.

What is claimed is:

1. A method for manufacturing an interconnection structure, comprising:
    providing a substrate structure, wherein the substrate structure comprises:
        a substrate,
        an interlayer dielectric layer on the substrate,
        a plurality of first through holes running through the interlayer dielectric layer, and
        a first metal layer filling the plurality of first through holes;
    forming a through hole structural layer on the substrate structure, wherein the through hole structural layer comprises a dual-damascene through hole structure, the dual-damascene through hole structure comprising:
        a second through hole and a third through hole in the through hole structural layer, and
        an opening on the second through hole and the third through hole,
        wherein the first metal layer in one of the first through holes of the plurality of first through holes is exposed in the second through hole,
        wherein the first metal layer in another one of the plurality of first through holes is exposed in the third through hole, and
        wherein the second through hole, the third through hole, and a part of the through hole structural layer between the second through hole and the third through hole are exposed in the opening;
    filling a second metal layer in the second through hole and the third through hole, wherein an upper surface of the second metal layer is lower than an upper surface of the part of the through hole structural layer between the second through hole and the third through hole;
    etching the part of the through hole structural layer between the second through hole and the third through hole so that the upper surface of the part is lower than the upper surface of the second metal layer; and
    after etching the part of the through hole structural layer, forming, in the opening, a third metal layer connected to the second metal layer.

2. The method according to claim 1, wherein after the part of the through hole structural layer between the second through hole and the third through hole is etched, the upper surface of the part of the through hole structural layer is lower than the upper surface of the second metal layer by 50 Å to 200 Å.

3. The method according to claim 1, wherein the part of the through hole structural layer between the second through hole and the third through hole is etched under the following process condition:
    at 20-millitorr to 200-millitorr gas pressure and 100-watt to 2000-watt etching power, and with argon (Ar) as a carrier gas, where an etching process is executed by using a mixed gas of $C_4F_8$, $C_4F_6$, and $O_2$.

4. The method according to claim 3, wherein
    a gas flow range of the $C_4F_8$ is 10 sccm to 50 sccm;
    a gas flow range of the $C_4F_6$ is 10 sccm to 50 sccm;
    a gas flow range of the $O_2$ is 2 sccm to 30 sccm; and
    a gas flow range of the Ar is 100 sccm to 5000 sccm.

5. The method according to claim 1, wherein:
    the through hole structural layer comprises:
        an etching stop layer on the substrate structure,
        a first dielectric layer on the etching stop layer, and
        a second dielectric layer on the first dielectric layer;
    a dielectric constant of the first dielectric layer is lower than a dielectric constant of the second dielectric layer;
    the dual-damascene through hole structure runs through the etching stop layer, the first dielectric layer, and the second dielectric layer; and
    the part of the through hole structural layer between the second through hole and the third through hole exposed in the opening is a part of the first dielectric layer between the second through hole and the third through hole.

6. The method according to claim 5, wherein a material of the first dielectric layer is a material with a low dielectric constant.

7. The method according to claim 5, wherein the step of forming a through hole structural layer on the substrate structure comprises:
    forming the etching stop layer on the substrate structure, the first dielectric layer on the etching stop layer, the second dielectric layer on the first dielectric layer, and a hard mask layer on the second dielectric layer;
    etching the hard mask layer, the second dielectric layer, and the first dielectric layer to form an initial dual-damascene through hole in which a partial surface of the etching stop layer is exposed;
    removing the hard mask layer after forming the initial dual-damascene through hole; and
    removing the exposed part of the etching stop layer using the initial dual-damascene through hole by means of an etching process to expose the first metal layer in the first through holes, so as to form the dual-damascene through hole structure.

8. The method according to claim 1, wherein:
  materials of the first metal layer and the third metal layer comprise copper (Cu); and
  a material of the second metal layer comprises cobalt.

9. The method according to claim 1, wherein in the step of forming the through hole structural layer, the first metal layer in two adjacent first through holes in the plurality of first through holes is exposed in each of the second through hole and the third through hole.

* * * * *